US012658410B2

(12) United States Patent (10) Patent No.: US 12,658,410 B2
Kim et al. (45) Date of Patent: Jun. 16, 2026

(54) SUBSTRATE PROCESSING APPARATUS INCLUDING PLURALITY OF ELECTRODES

(71) Applicant: Samsung Electronics Co., Ltd., Suwon-si (KR)

(72) Inventors: Yunhwan Kim, Hwaseong-si (KR); Dougyong Sung, Seoul (KR); Byeongsang Kim, Hwaseong-si (KR); Youngjin Noh, Ansan-si (KR); Namkyun Kim, Pyeongtaek-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 577 days.

(21) Appl. No.: 17/713,433

(22) Filed: Apr. 5, 2022

(65) Prior Publication Data

US 2023/0100582 A1 Mar. 30, 2023

(30) Foreign Application Priority Data

Sep. 29, 2021 (KR) ........................ 10-2021-0128730

(51) Int. Cl.
*H01J 37/32* (2006.01)
*H10P 72/00* (2026.01)

(52) U.S. Cl.
CPC .. *H01J 37/32568* (2013.01); *H01J 37/32091* (2013.01); *H01J 37/32715* (2013.01);
(Continued)

(58) Field of Classification Search
CPC .......... H01J 37/32568; H01J 37/32091; H01J 37/32715; H01J 2237/2007;
(Continued)

(56) References Cited

U.S. PATENT DOCUMENTS 5,761,023 A * 6/1998 Lue ..................... G03F 7/70708
361/233
6,215,640 B1 * 4/2001 Hausmann .......... H01L 21/6833
361/115
(Continued)

FOREIGN PATENT DOCUMENTS

KR 10-1996-0012283 4/1996
KR 10-2008-0014660 A 2/2008
(Continued)

OTHER PUBLICATIONS

Office Action for Korean Application No. 10-2021-0128730 dated Feb. 4, 2025.
(Continued)

*Primary Examiner* — Patrick S Ott
(74) *Attorney, Agent, or Firm* — Harness, Dickey & Pierce, P.L.C.

(57) ABSTRACT

A substrate processing apparatus includes a base plate, an upper plate on the base plate, a DC power supply configured to supply power to the upper plate, and a controller interconnecting the upper plate and the DC power supply. The upper plate includes a first electrode, and a second electrode spaced apart from the first electrode. The controller includes a first controller interconnecting the first electrode and the DC power supply, and a second controller interconnecting the second electrode and the DC power supply. The DC power supply is configured to apply a first voltage to the first electrode via the first controller, and configured to apply a second voltage to the second electrode via the second controller. The first voltage and the second voltage are different.

18 Claims, 7 Drawing Sheets

(52) U.S. Cl.
CPC .................. *H01J 2237/2007* (2013.01); *H01J 2237/20235* (2013.01); *H01J 2237/334* (2013.01); *H10P 72/0421* (2026.01)

(58) Field of Classification Search
CPC ...... H01J 2237/20235; H01J 2237/334; H01L 21/67069; H01L 21/67109; H01L 21/6833; H01L 21/68742; H01L 21/6875; B23Q 3/15; H02N 13/00
See application file for complete search history.

(56) References Cited

U.S. PATENT DOCUMENTS

| | | | |
|---|---|---|---|
| 6,625,003 | B2 | 9/2003 | Loo et al. |
| 8,519,332 | B2 | 8/2013 | Miya et al. |
| 8,673,166 | B2 | 3/2014 | Okita et al. |
| 10,475,688 | B2* | 11/2019 | Ishimura ........... H01L 21/67103 |
| 2002/0027762 | A1* | 3/2002 | Yamaguchi ............ G03F 7/707 |
| | | | 279/128 |
| 2002/0144657 | A1 | 10/2002 | Chiang et al. |
| 2006/0043065 | A1* | 3/2006 | Buchberger ...... H01L 21/67109 |
| | | | 156/345.1 |
| 2007/0014073 | A1* | 1/2007 | Retzlaff .............. H01L 21/6833 |
| | | | 361/234 |
| 2008/0073032 | A1 | 3/2008 | Koshiishi et al. |
| 2011/0140712 | A1 | 6/2011 | Inoue |
| 2012/0320491 | A1* | 12/2012 | Doh .................... H01L 21/6833 |
| | | | 361/234 |
| 2016/0035610 | A1 | 2/2016 | Park et al. |
| 2018/0277418 | A1* | 9/2018 | Sato ................. H01L 21/67109 |
| 2020/0013595 | A1* | 1/2020 | Lee ................... H01J 37/32715 |
| 2020/0135434 | A1* | 4/2020 | Nakagawasai .... H01L 21/67109 |
| 2020/0185248 | A1* | 6/2020 | Sarode Vishwanath ..................... H01L 21/6833 |
| 2021/0074523 | A1 | 3/2021 | Ramachandran et al. |
| 2022/0026151 | A1 | 1/2022 | Araki et al. |
| 2022/0301916 | A1 | 9/2022 | Choi et al. |

FOREIGN PATENT DOCUMENTS

| | | |
|---|---|---|
| KR | 10-2016-0015510 A | 2/2016 |
| KR | 10-2018-0108470 A | 10/2018 |
| KR | 10-2019-0103795 A | 9/2019 |
| KR | 10-2021-0016929 A | 2/2021 |
| KR | 10-2021-0087536 A | 7/2021 |

OTHER PUBLICATIONS

Notice of Allowance for Korean Application No. 10-2021-0128730 dated Oct. 2, 2025.

* cited by examiner

152

SUBSTRATE PROCESSING APPARATUS INCLUDING PLURALITY OF ELECTRODES

CROSS-REFERENCE TO THE RELATED APPLICATION

This application claims priority from Korean Patent Application No. 10-2021-0128730, filed on Sep. 29, 2021, in the Korean Intellectual Property Office, the disclosure of which is incorporated herein by reference in its entirety.

BACKGROUND

1. Field

The example embodiments of the disclosure relate to a substrate processing apparatus including a plurality of electrodes.

2. Description of the Related Art

As an aspect ratio of a semiconductor device increases, there is often an increased use of electric power in a substrate processing apparatus. When there is an increase in the electric power used in the substrate processing apparatus, the temperature of an edge region in a substrate increases and, as such, non-uniformity of the temperature of the substrate may increase.

SUMMARY

The example embodiments of the disclosure provide a substrate processing apparatus capable of more uniformly controlling a temperature distribution of a substrate during execution of a process.

The example embodiments of the disclosure provide a substrate processing apparatus capable of suppressing an aching phenomenon during execution of a process.

A substrate processing apparatus according to an example embodiment of the disclosure may include a base plate, an upper plate on the base plate, a DC power supply configured to supply power to the upper plate, and a controller interconnecting the upper plate and the DC power supply. The upper plate may include a first electrode, and a second electrode spaced apart from the first electrode. The controller may include a first controller interconnecting the first electrode and the DC power supply, and a second controller interconnecting the second electrode and the DC power supply. The DC power supply may apply a first voltage to the first electrode via the first controller and may apply a second voltage to the second electrode via the second controller. The first voltage and the second voltage may be different.

A substrate processing apparatus according to an example embodiment of the disclosure may include an electrostatic chuck including a base plate, an upper plate on the base plate, and a bushing and a porous block in the base plate, a DC power supply configured to supply power to the upper plate, and a controller interconnecting the upper plate and the DC power supply. The upper plate may include a first electrode, and a second electrode spaced apart from the first electrode. The controller may include a first controller interconnecting the first electrode and the DC power supply, and a second controller interconnecting the second electrode and the DC power supply. The DC power supply may apply a first voltage to the first electrode via the first controller, and may apply a second voltage to the second electrode via the second controller. The first voltage and the second voltage may be different. The bushing may include a first bushing contacting the base plate, and a second bushing in the first bushing. The porous block may be disposed on the second bushing in the first bushing. The first bushing may include a cylinder portion surrounding the second bushing, and a flange portion surrounding a portion of the porous block. A first thickness of the flange portion may be greater than a second thickness of the cylinder portion.

A substrate processing apparatus according to an example embodiment of the disclosure may include an electrostatic chuck including a base plate, an upper plate on the base plate, and a lift pin bushing and a lift pin in the base plate, a DC power supply configured to supply power to the upper plate, and a controller interconnecting the upper plate and the DC power supply. The upper plate may include a first electrode, and a second electrode spaced apart from the first electrode. The controller may include a first controller interconnecting the first electrode and the DC power supply, and a second controller interconnecting the second electrode and the DC power supply. The DC power supply may apply a first voltage to the first electrode via the first controller and may apply a second voltage to the second electrode via the second controller. The first voltage and the second voltage may be different. The lift pin may be disposed in the lift pin bushing, and a top surface of the lift pin bushing may be disposed at a higher level than a top surface of the base plate.

DETAILED DESCRIPTION OF EXAMPLE EMBODIMENTS

Figure 1:
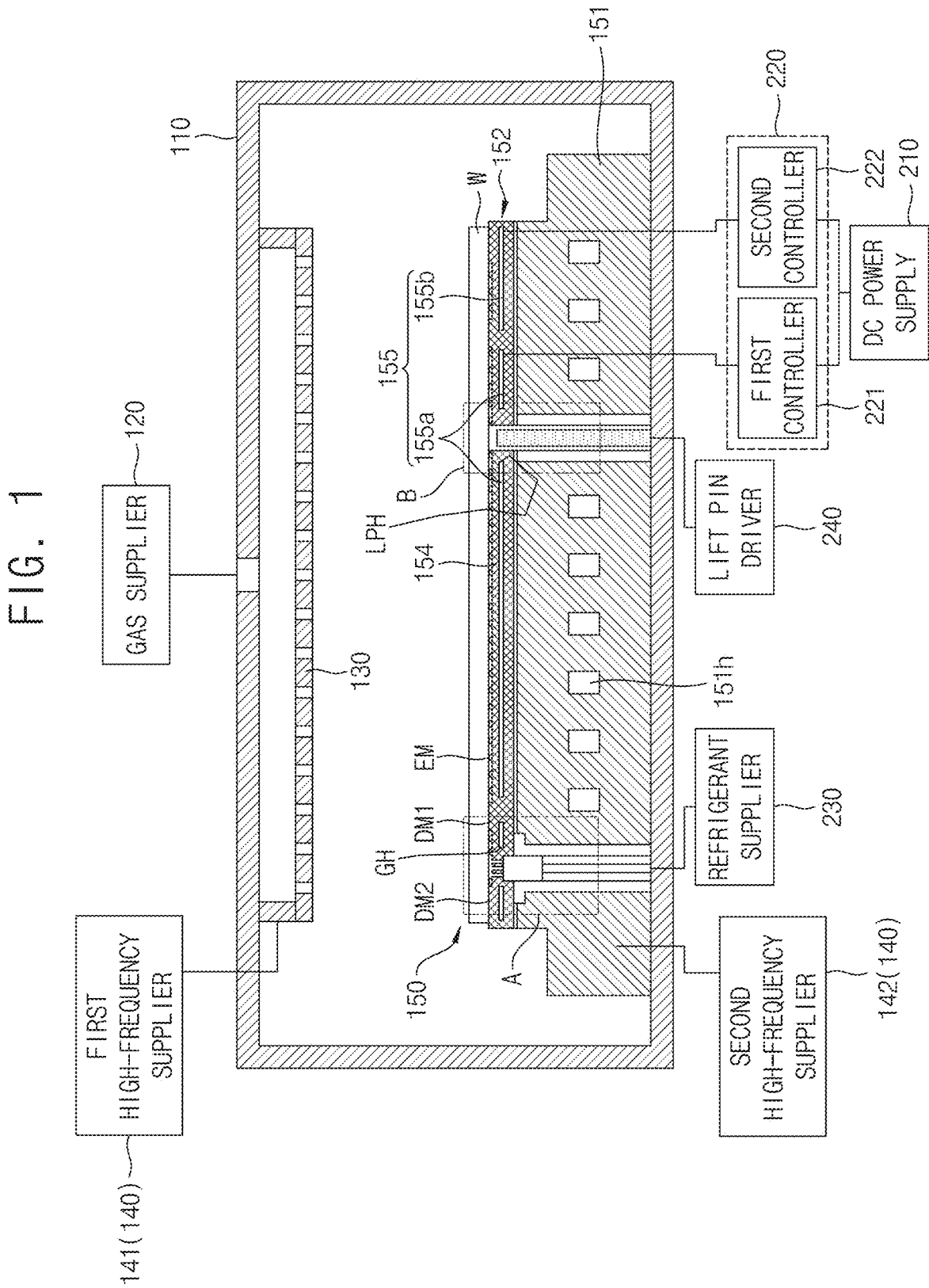
FIG. 1 is a cross-sectional view of a substrate processing apparatus according to an example embodiment of the disclosure.
Figure 2:
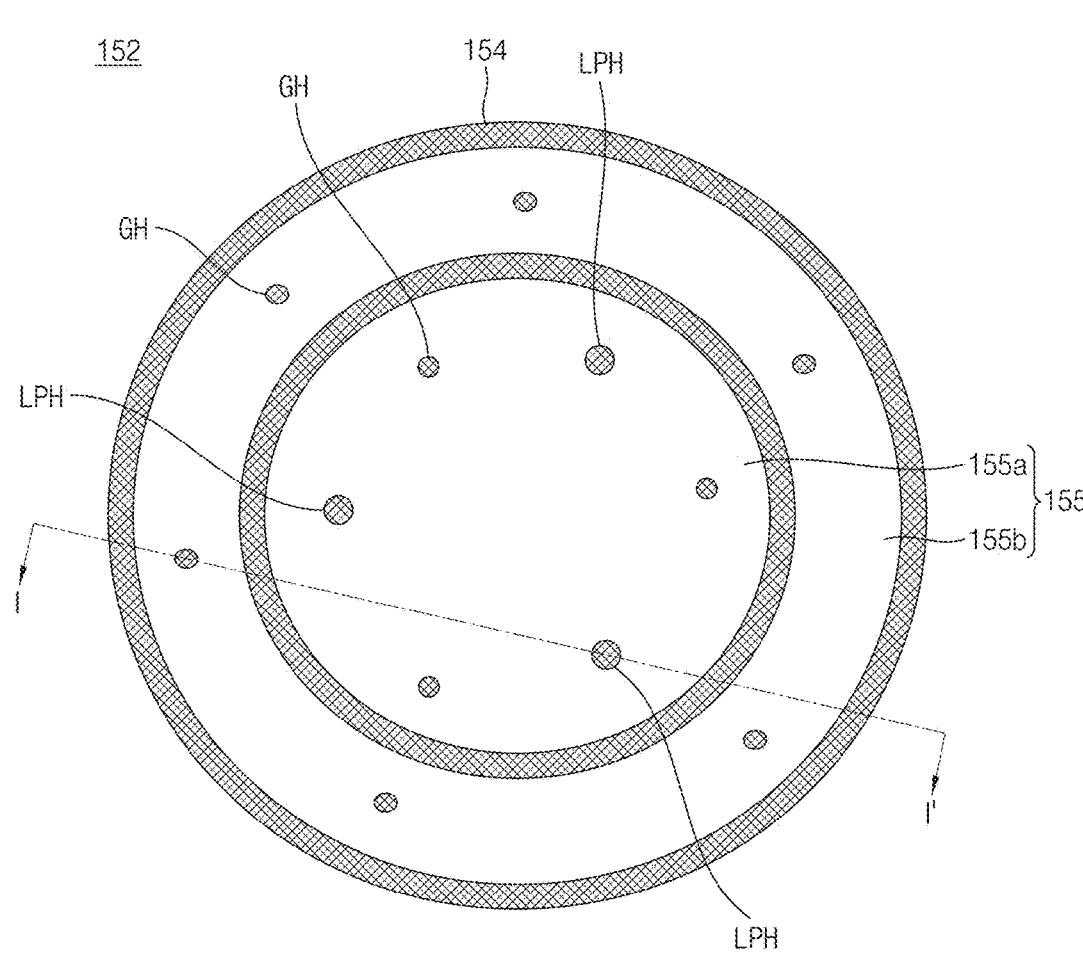
FIG. 2 is a plan view of an upper plate of FIG. 1.

FIG. 1 is a cross-sectional view of a substrate processing apparatus according to an example embodiment of the disclosure. FIG. 2 is a plan view of an upper plate of FIG. 1. A cross-section taken along line I-I' in FIG. 2 may correspond to the upper plate shown in FIG. 1. Plan view is a visible representation of a first plane.

Referring to FIG. 1, in an example embodiment, the substrate processing apparatus may be a capacitively coupled plasma (CCP) etching apparatus. Alternatively, the substrate processing apparatus may be an inductively coupled plasma (ICP) or microwave plasma etching apparatus. In an example embodiment, the substrate processing apparatus may include a chamber 110, a gas supplier 120, a shower head 130, a high-frequency supplier 140, an electrostatic chuck 150, a DC power supply 210, and a controller 220.

The chamber 110 may provide, therein, a space in which a plasma process is executed. The inner space of the chamber 110 may be sealed during execution of the plasma process. The chamber 110 may be made of a metal material. For example, the chamber 110 may include aluminum.

The gas supplier 120 may supply reactive gas to the inner space of the chamber 110. The reactive gas may etch a substrate W or a thin film on the substrate W, or may deposit a thin film on the substrate W.

The shower head 130 may be provided in the chamber 110. The shower head 130 may be disposed at an upper portion of the chamber 110. The shower head 130 may spray the reactive gas supplied by the gas supplier 120 over the entire region of the substrate W. The shower head 130 may include a conductive material. The shower head 130 may include an upper electrode. The upper electrode may be connected to the high-frequency supplier 140.

The high-frequency supplier 140 may provide high-frequency power to the upper electrode of the shower head 130 and the electrostatic chuck 150. In an example embodiment, the high-frequency supplier 140 may include a first high-frequency supplier 141 connected to the upper electrode or the electrostatic chuck 150, and a second high-frequency supplier 142 connected to the electrostatic chuck 150. The first high-frequency supplier 141 may provide high-frequency power to the upper electrode or the electrostatic chuck 150. The high-frequency power may induce a plasma in the chamber 110. The second high-frequency supplier 142 may provide bias high-frequency power to the electrostatic chuck 150. The bias high-frequency power may concentrate a plasma onto a substrate.

The electrostatic chuck 150 may be disposed in the chamber 110. A substrate W may be disposed on the electrostatic chuck 150. The electrostatic chuck 150 may support the substrate W. The electrostatic chuck 150 may include a base plate 151 and an upper plate 152. The base plate 151 may be disposed at a lower portion of the chamber 110. The base plate 151 may be wider or greater than the substrate W in plan view. For example, the base plate 151 may include aluminum or an aluminum alloy. The upper plate 152 may be disposed on the base plate 151. The substrate W may be disposed on the upper plate 152. A cooling water hole 151$h$ may be formed in the base plate 151 and, as such, when a plasma is induced on the electrostatic chuck 150, the electrostatic chuck 150 may be cooled by cooling water provided in the cooling water hole 151$h$.

The DC power supply 210 may provide a constant voltage to the electrostatic chuck 150. The DC power supply 210 may provide a constant voltage to the upper plate 152. The electrostatic chuck 150 may fix the substrate W to the electrostatic chuck 150 using the constant voltage provided from the DC power supply 210. The substrate W may be fixed to the electrostatic chuck 150 in accordance with the Johnsen-Rahbek effect or Coulomb's law of the constant voltage.

The controller 220 may electrically interconnect the DC power supply 210 and the electrostatic chuck 150. The controller 220 may electrically interconnect the DC power supply 210 and the upper plate 152 of the electrostatic chuck 150. The controller 220 may adjust the level of the constant voltage provided from the DC power supply 210 to the electrostatic chuck 150.

Referring to FIGS. 1 and 2, the upper plate 152 may include a base 154 and an electrode 155. The base 154 may include dielectrics. For example, the base 154 may include a ceramic which is $Al_2O_3$. The electrode 155 may be disposed in the base 154. The base 154 may surround the electrode 155. The electrode 155 may include a conductive material, such as metals including nickel (Ni), tungsten (W), tantalum (Ta), etc.

The upper plate 152 may include a plurality of electrodes 155. In an example embodiment, the upper plate 152 may include a first electrode 155a and a second electrode 155b. The first electrode 155a and the second electrode 155b may be disposed to be spaced apart from each other. For example, the first electrode 155a may have a disc shape, and the second electrode 155b may have a ring shape. The second electrode 155b may be disposed around the first electrode 155a. In plan view, the second electrode 155b may surround the first electrode 155a. In plan view, the first electrode 155a may be disposed inside the second electrode 155b. The second electrode 155b may be disposed nearer to an edge of the upper plate 152 than the first electrode 155a.

Each of the first electrode 155a and the second electrode 155b may be electrically connected to the DC power supply 210. The first electrode 155a and the second electrode 155b may be electrically connected to the DC power supply 210 via the controller 220. In an example embodiment, the controller 220 may include a first controller 221 and a second controller 222. The first controller 221 may interconnect the first electrode 155a and the DC power supply 210. The second controller 222 may interconnect the second electrode 155b and the DC power supply 210. The DC power supply 210 may provide a constant voltage to the first electrode 155a via the first controller 221. The first controller 221 may adjust the level of the constant voltage received from the DC power supply 210, and may provide the resultant voltage to the first electrode 155a. The first controller 221 may provide a first voltage to the first electrode 155a. The DC power supply 210 may provide a constant voltage to the second electrode 155b via the second controller 222. The second controller 222 may adjust the level of the constant voltage received from the DC power supply 210, and may provide the resultant voltage to the second electrode 155b. The second controller 222 may provide a second voltage to the second electrode 155b. The level of the first voltage provided to the first electrode 155a may be different from the level of the second voltage provided to the second electrode 155b. For example, the level of the second voltage may be higher than the level of the first voltage, but the example embodiments of the disclosure are not limited thereto.

The temperature of the substrate W during execution of a plasma process for the substrate W in the substrate processing apparatus may be non-uniform throughout the entire region of the substrate W. In accordance with the example embodiments of the disclosure, chucking force between the substrate W and the electrostatic chuck 150 may be varied such that chucking forces in regions of the substrate W having different temperature distributions are different and, as such, it may be possible to adjust the temperature in the entire region of the substrate W to be uniform. As the level of a voltage applied to the electrode 155 increases, the magnitude of electrostatic force fixing the substrate W to the electrostatic chuck 150, that is, chucking force, may increase. As the chucking force increases, contact resistance between the substrate W and the upper plate 152 may decrease and, as such, heat transfer efficiency between the electrostatic chuck 150 and the substrate W may be enhanced. Since the electrostatic chuck 150 is cooled by cooling water provided in the cooling water hole 151$h$ during execution of a plasma process, it may be possible to decrease a temperature in a region of the substrate W having a relatively high temperature by increasing chucking force in the region.

For example, an edge of the substrate W may have a higher temperature than other regions of the substrate W during execution of the plasma process in accordance with an example embodiment of the disclosure, as described above, the second electrode 155b disposed at a position corresponding to the edge of the substrate W may be separated from the first electrode 155a disposed at a position corresponding to a center of the substrate W, and the first voltage provided to the first electrode 155a and the second voltage provided to the second electrode 155b may be set such that the second voltage is higher than the first voltage. As a result, the region of the substrate W corresponding to the second electrode 155b may exhibit higher chucking force and lower contact resistance than the region of the substrate W corresponding to the first electrode 155a and, as such, heat transfer efficiency by the electrostatic chuck 150 cooled by cooling water may be higher in the region of the substrate W corresponding to the second electrode 155b than in the region of the substrate W corresponding to the first electrode 155a. Thus, it may be possible to decrease the temperature of the region of the substrate W corresponding to the second electrode 155b to a level similar to the temperature of the region of the substrate W corresponding to the first electrode 155a.

Although the upper plate 152 is shown in FIGS. 1 and 2 as including two electrodes, the example embodiments of the disclosure are not limited thereto, and the upper plate 152 may include three or more electrodes separated from one another. In this case, the number of controllers 220 may be three or more. The number of controllers 220 may correspond to the number of electrodes 155.

Figure 3:
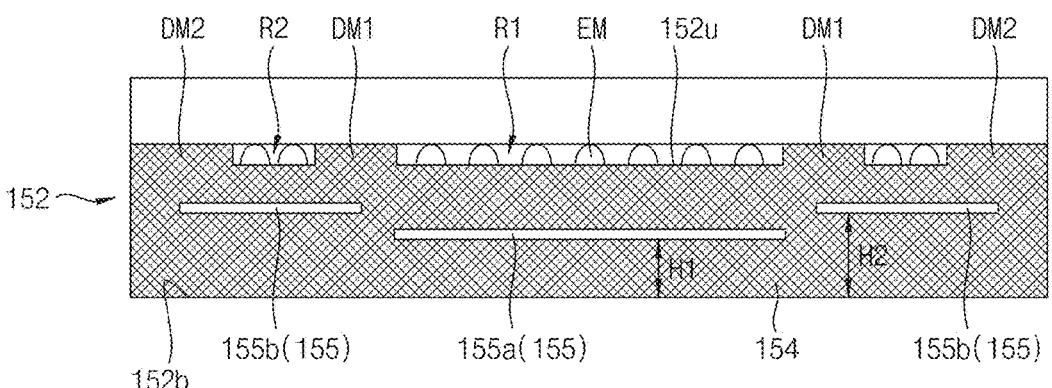
FIG. 3 is a schematic sectional view showing an upper plate according to an example embodiment.

FIG. 3 is a schematic sectional view showing an upper plate according to an example embodiment.

Referring to FIG. 3, a plurality of electrodes 155 included in an upper plate 152 may be disposed at different levels with reference to a bottom surface 152b of the upper plate 152. A minimum distance H1 from the bottom surface 152b of the upper plate 152 to a first electrode 155a may be different from a minimum distance H2 from the bottom surface 152b of the upper plate 152 to a second electrode 155b. In an example embodiment, the minimum distance from the bottom surface 152b of the upper plate 152 to the first electrode 155a may be smaller than the minimum distance 112 from the bottom surface 152b of the upper plate 152 to the second electrode 155b. In this case, the minimum distance between the second electrode 155b and the substrate W may be smaller than the minimum distance between the first electrode 155a and the substrate W.

The magnitude of chucking force between the electrode 155 and the substrate W may be varied in accordance with the distance between the electrode 155 and the substrate W. For example, when the level of a voltage for the electrode 155 is constant, the magnitude of the chucking force may increase as the distance between the electrode 155 and the substrate W decreases. Accordingly, it may be possible to increase chucking force for a region of the substrate W corresponding to the electrode 155 by decreasing the distance between the electrode 155 and the substrate W. As the chucking force for the region of the substrate W corresponding to the electrode 155 increases, the contact resistance between the region and the upper plate 152 may decrease and, as such, heat transfer efficiency for the region may be enhanced.

During execution of a plasma process, an edge region of the substrate W corresponding to the second electrode 155b may exhibit a higher temperature than a central region (or a region other than the edge region) of the substrate W corresponding to the first electrode 155a. To this end, the minimum distance between the second electrode 155b and the substrate W may be determined to be smaller than the minimum distance between the first electrode 155a and the substrate W, thereby causing chucking force between the edge region of the substrate W and the upper plate 152 to be higher than chucking force between the central region (or a region other than the edge region) of the substrate W and the upper plate 152 (in this case, the level of a voltage applied to the first electrode 155a may be equal to or lower than the level of a voltage applied to the second electrode 155b, without being limited thereto). As a result, the heat transfer efficiency between the edge region of the substrate W and the upper plate 152 (or an electrostatic chuck) may be higher than the heat transfer efficiency between the central region of the substrate W and the upper plate 152 (or the electrostatic chuck), and the temperate of the edge region of the substrate W may be lowered to the temperature of the central region of the substrate W.

In an example embodiment, the minimum distance H1 from the bottom surface 152b of the upper plate 152 to the first electrode 155a may be greater than or equal to the minimum distance H2 from the bottom surface 152b of the tipper plate 152 to the second electrode 155b. The distance from the bottom surface 152b of the upper plate 152 to the electrode 155 may be varied in accordance with the level of the voltage applied to the electrode 155 and the position of the electrode 155 according to a temperature distribution of the substrate W.

Figure 4:
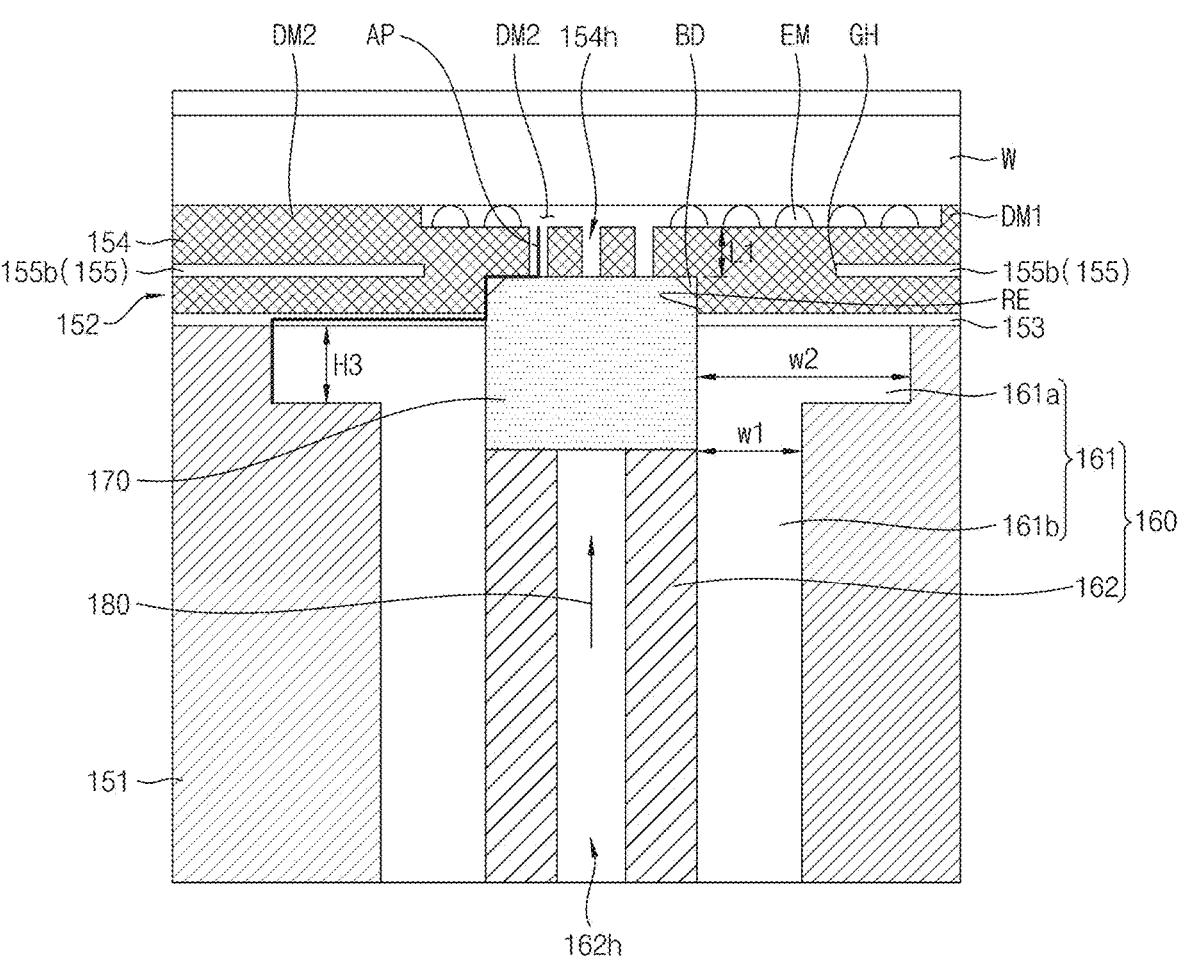
FIG. 4 is an enlarged view of a portion A of FIG. 1 according to an example embodiment.

FIG. 4 is an enlarged view of a portion A of FIG. 1 according to an example embodiment.

Referring to FIGS. 1 and 4, the electrostatic chuck 150 may include the base plate 151, the upper plate 152, an adhesive layer 153, a bushing 160, and a porous block 170. The substrate processing apparatus may include a refrigerant supplier 230 connected to the bushing 160.

The adhesive layer 153 may be interposed between the base plate 151 and the upper plate 152. The adhesive layer 153 may be attached to both the base plate 151 and the upper plate 152 and, as such, may fix the upper plate 152 to the base plate 151. The adhesive layer 153 may include an adhesive material having adhesion, and may include, for example, an epoxy resin-based adhesive, without being limited thereto.

The bushing 160 may be disposed in the base plate 151. The base plate 151 may surround the bushing 160. The bushing 160 may extend downwards from an upper portion of the base plate 151. The bushing 160 may include a first bushing 161 and a second bushing 162.

The first bushing 161 may directly contact the base plate 151. A top surface of the first bushing 161 may be coplanar with a top surface of the base plate 151. The adhesive layer 153 may be interposed between the first bushing 161 and the upper plate 152. The adhesive layer 153 may contact both the top surface of the first bushing 161 and a bottom surface of the upper plate 152 and, as such, may interconnect the first bushing 161 and the upper plate 152. The first bushing 161 may include an inner hole vertically extending through an interior of the first bushing 161. The second bushing 162 may be disposed in the inner hole of the first bushing 161. The first bushing 161 may surround the second bushing 162. The second bushing 162 may contact an inner side surface of the first bushing 161 defining the inner hole of the first bushing 161. The second bushing 162 may include a gas hole 162h vertically extending through an interior of the second bushing 162. The first bushing 161 and the second bushing 162 may include a ceramic material such as $Al_2O_3$.

A portion of the porous block 170 may be disposed in the inner hole of the first bushing 161. The first bushing may surround the portion of the porous block 170. The portion of the porous block 170 may contact the inner side surface of the first bushing 161. The porous block 170 may be disposed on the second bushing 162. A bottom surface of the porous block 170 may contact a top surface of the second bushing 162. The second bushing 162 may vertically overlap with the porous block 170.

The upper plate 152 may include a recess RE recessed from the bottom surface of the upper plate 152 toward a top surface of the upper plate 152. An upper portion of the porous block 170 may be disposed in the recess RE of the upper plate 152. The upper plate 152 may cover the upper portion of the porous block 170. The porous block 170 may contact the upper plate 152. A top surface of the porous block 170 may be disposed at a higher level than the bottom surface of the upper plate 152 with reference to the top surface of the base plate 151. The top surface of the porous block 170 may be disposed at a higher level than the top surface of the first bushing 161 with reference to the top surface of the base plate 151. The top surface of the porous block 170 may be disposed at a higher level than the adhesive layer 153 with reference to the top surface of the base plate 151. The porous block 170 may contact the adhesive layer 153. The porous block 170 may include dielectrics. For example, the porous block 170 may include a ceramic having a pore density of about 20 to 60%. For example, the porous block 170 may be a circular pillar having a diameter of about 3 to 5 mm and a height of about 4 to 5 mm. A bonding material BD may be interposed between the porous block 170 and the upper plate 152. The bonding material BD may be disposed in the recess RE. The porous block 170 may be fixed in the recess RE of the upper plate 152 by the bonding material BD.

A plate hole 154h may be formed at the upper plate 152. The plate hole 154h may be formed at a position of the upper plate 152 vertically overlapping with the porous block 170. The plate hole 154h may expose a portion of the top surface of the porous block 170. For example, the diameter of the plate hole 154h may be about 0.01 to 0.3 mm.

The second bushing 162 may be connected to the refrigerant supplier 230. For example, the second bushing 162 may be connected to the refrigerant supplier 230 via a gas tube. The refrigerant supplier 230 may supply a refrigerant 180 to the gas hole 162h of the second bushing 162. The refrigerant 180 may be provided to a bottom surface of the substrate W via the gas hole 162h of the second bushing 162, the porous block 170, and the plate hole 154h of the upper plate 152. When the substrate W is heated by a plasma process, the refrigerant 180 may cool the substrate W. For example, the refrigerant 180 may include helium (He).

As a plasma is produced in the chamber 110, a potential difference may be generated between the substrate W and the electrostatic chuck 150. When a potential difference of a predetermined level or more is generated between the substrate W and the electrostatic chuck 150, and the refrigerant 180 is provided to the plate hole 154h, a discharge phenomenon caused by the refrigerant 180, that is, a discharge plasma, may be generated in the plate hole 154h. The porous block 170 may be damaged by the discharge plasma. Whether or not the discharge plasma is generated may be determined depending on a vertical length L1 of the plate hole 154h (when the diameter of the plate hole 154h is constant). The vertical length L1 may correspond to the minimum distance between the top surface of the porous block 170 and the top surface of the upper plate 152. As the vertical length L1 is reduced, probability of generation of a discharge plasma may be reduced. In the example embodiments of the disclosure, accordingly, it may be possible to reduce the vertical length L1 of the plate hole 154h by forming the recess RE at a lower portion of the upper plate 152, and inserting the porous block 170 into the recess RE. Possibility of generation of a discharge plasma may be reduced by inserting the porous block 170 into the recess RE, thereby reducing the vertical length L1 of the plate hole 154h.

In an example embodiment, the first bushing 161 may include a cylinder portion 161b and a flange portion 161a. The flange portion 161a may be disposed on the cylinder portion 161b, and the cylinder portion 161b may surround the second bushing 162. The cylinder portion 161b may surround a lower portion of the porous block 170. The flange portion 161a may surround a portion of the porous block 170. The flange portion 161a may horizontally extend from an inner portion of the first bushing 161, at which the porous block 170 is disposed, toward the base plate 151. The flange portion 161a may protrude outwards from an outer side surface of the cylinder portion 161b. The cylinder portion 161b and the flange portion 161a may have different thicknesses. A second thickness w2 of the flange portion 161a may be greater than a first thickness w1 of the cylinder portion 161b. The first thickness w1 may mean a horizontal width from an inner side surface of the cylinder portion 161b to an outer side surface of the cylinder portion 161b, and the second thickness w2 may mean a horizontal width from an inner side surface of the flange portion 161a to an outer side surface of the flange portion 161a. For example, the first thickness w1 may be about 1 to 5 mm, and the second thickness w2 may be about 3 to 7 mm. The inner diameter of the flange portion 161a and the inner diameter of the cylinder portion 161b may be equal, and the outer diameter of the flange portion 161a and the outer diameter of the cylinder portion 161b may be different. The outer diameter of the flange portion 161a may be greater than the outer diameter of the cylinder portion 161b. For example, the outer diameter of the flange portion 161a may be about 8 to 10 mm, and the outer diameter of the cylinder portion 161b may be about 6 to 8 mm. The flange portion 161a may be connected to an upper portion of the cylinder portion 161b and, as such, the first bushing 161 may have an L-shaped cross-section. The flange portion 161a may constitute an upper portion of the first bushing 161. A top surface of the flange portion 161a may constitute the top surface of the first bushing 161. The top surface of the flange portion 161a may be coplanar with the top surface of the base plate 151.

As a plasma is produced in the chamber 110 in a vacuum state and, as such, a potential difference of a predetermined level or more is generated between the substrate W and the electrostatic chuck 150, aching may occur between the bushing 160 and the upper plate 152 and between the porous block 170 and the upper plate 152. Due to aching, the bushing 160, the porous block 170 and the upper plate 152 may be damaged. Whether or not aching occurs may be determined depending on the length of an aching path AP formed between the substrate W and the upper plate 152. For example, the aching path AP may include the plate hole 154h, a region between the porous block 170 and the upper plate 152, a region between the top surface of the flange portion 161a and the upper plate 152, and a region between a side surface of the flange portion 161a and the base plate 151. Probability of occurrence of aching may be reduced as the length of the aching path AP increases. In the example embodiments of the disclosure, accordingly, it may be possible to reduce probability of occurrence of aching by increasing the length of the aching path AP via the flange portion 161a of the first bushing 161. As the thickness w2 of the aching path AP increases, the aching path AP is lengthened and, as such, probability of occurrence of aching may be reduced. In addition, as a height H3 of the flange portion 161a increases, the aching path AP is lengthened and, as such, probability of occurrence of aching may be reduced. For example, the height H3 of the flange portion 161a may be about 1 to 3 mm.

In an example embodiment, the thickness of the adhesive layer 153 between the first bushing 161 and the upper plate 152 may be different from the thickness of the adhesive layer 153 between the base plate 151 and the upper plate 152. For example, the thickness of the adhesive layer 153 between the first bushing 161 and the upper plate 152 may be smaller than the thickness of the adhesive layer 153 between the base plate 151 and the upper plate 152. In this case, the level of the top surface of the first bushing 161 may be higher than the level of the top surface of the base plate 151, but lower than the level of the bottom surface of the upper plate 152 with respect to a bottom surface of the base plate 151. For example, the thickness of the adhesive layer 153 between the first bushing 161 and the upper plate 152 may be 100 μm or less. As the thickness of the adhesive layer 153 between the first bushing 161 and the upper plate 152 is reduced, insulation strength for the adhesive layer 153 and/or the first bushing 161 may increase.

Referring to FIGS. 1, 2 and 4, the electrode 155 of the upper plate 152 may include a first hole GH and a second hole LPH. Each of the first hole GH and the second hole LPH may be plural in number. Each of the first hole GH and the second hole LPH may extend through the electrode 155. The first hole GH may be formed at each of the first electrode 155a and the second electrode 155b, and the second hole LPH may be formed at the first electrode 155a.

The first hole GH may vertically overlap with the porous block 170 and the second bushing 162. The first hole GH may vertically overlap with at least a portion of the first bushing 161. The plate hole 154h may vertically overlap with the first hole GH. The plate hole 154h may extend through the first hole GH, and a portion of the plate hole 154h may be disposed in the first hole GH. In an example embodiment, a portion of the porous block 170 may be disposed in the first hole GH. The second electrode 155b may be spaced apart from the plate hole 154h and the porous block 170. The second hole LPH may vertically overlap with a lift pin ("192" in FIG. 7) which will be described later. The second hole LPH will be described later in detail with reference to FIG. 7.

Figure 5:
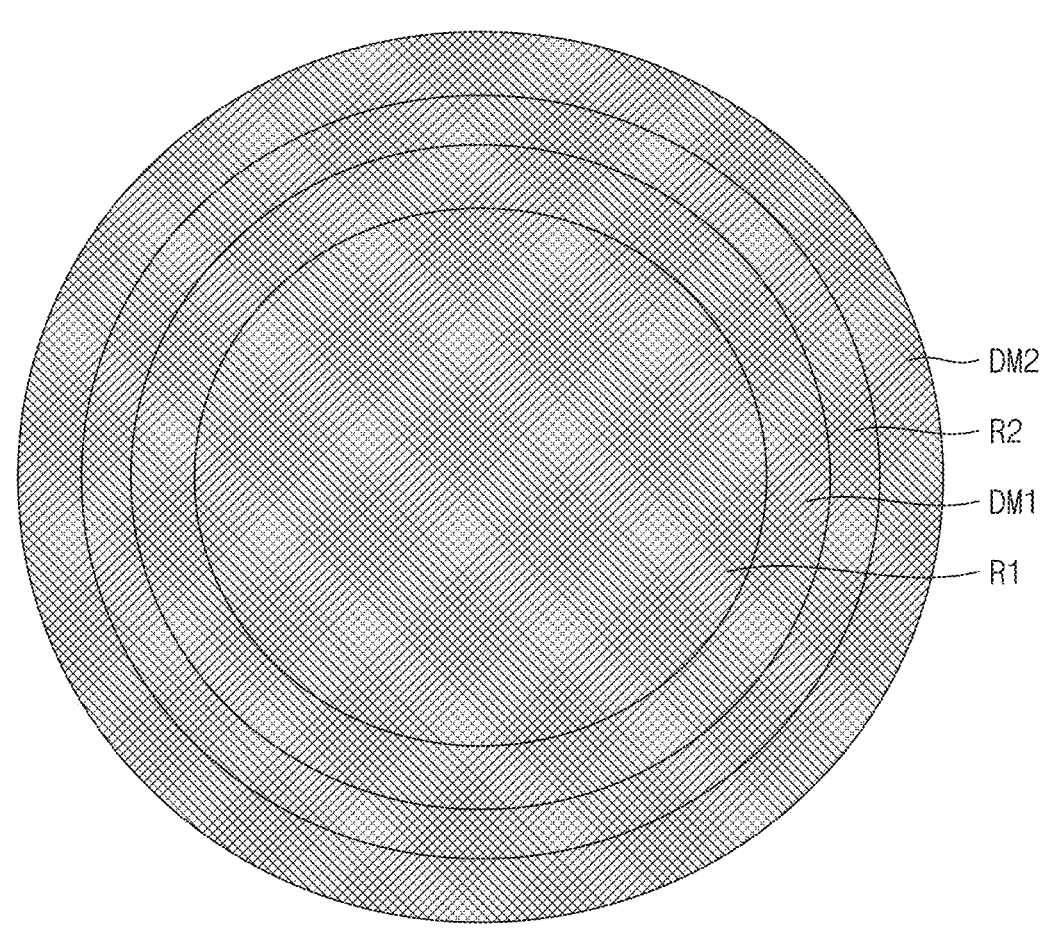
FIG. 5 is a schematic plan view of the upper plate of FIG. 3.

FIG. 5 is a schematic plan view of the upper plate of FIG. 3. An embossed portion is omitted from FIG. 5, for convenience of illustration.

Referring to FIG. 1 and FIGS. 3 to 5, the base 154 of the upper plate 152 may include dams DM1 and DM2 and an embossed portion EM. The dams DM1 and DM2 may be formed to protrude upwards from a top surface 152u (cf. FIG. 3) of the upper plate 152. The base 154 may include a plurality of dams DM1 and DM2. In an example embodiment, the base 154 may include a first dam DM1 and a second dam DM2. The first dam DM1 may have the form of a ring having an outer diameter smaller than the diameter of the upper plate 152 in plan view. The first dam DM1 may define a first region R1. The first region R1 may be defined by the top surface 152u of the upper plate 152 and the first dam DM1. The first region R1 may be circular in plan view. The second dam DM2 may be disposed outside the first dam DM1. The second dam DM2 may have the form of a ring having an outer diameter equal to the diameter of the upper plate 152. The second dam DM2 may define a second region R2 together with the first dam DM1. The second region R2 may be defined by the top surface 152u of the upper plate 152, the first dam DM1 and the second dam DM2. The substrate W may be supported by the first dam DM1 and the second dam DM2. The first region R1 and the second region R2 may be formed under the substrate W.

The embossed portion EM may be disposed in each of the first region R1 and the second region R2. The embossed portion EM may be disposed on the top surface 152u of the upper plate 152, and may contact a bottom surface of the substrate W. The embossed portion EM may support the substrate W. The embossed portion EM may have the same height as the dams DM1 and DM2. For example, the embossed portion EM may include dielectrics. For example, the heights of the dams DM1 and DM2 and the embossed portion EM may be about 10 μm.

The refrigerant supplier 230 may supply the refrigerant 180 to the second region R2 via the bushing 160, the porous block 170 and the plate hole 154h. Although not shown, the refrigerant supplier 230 may supply the refrigerant 180 to the first region R1 via the bushing, the porous block and the plate hole which are disposed under the first region R1 (for example, at a position vertically overlapping with the first hole GH formed at the first electrode 155a). As the area of each of the first region R1 and the second region R2 increases, the contact area between the refrigerant 180 and the bottom surface of the substrate W may increase. The heat transfer efficiency between the refrigerant 180 and the substrate W may be varied in accordance with the contact area between the refrigerant 180 and the bottom surface of the substrate W. In the example embodiments of the disclosure, accordingly, the heat transfer efficiency between the substrate W and the refrigerant 180 may be adjusted by adjusting the area of each of the first region R1 and the second region R2 using the dams DM1 and DM2. The area of each of the first region R1 and the second region R2 may be determined in accordance with a temperature distribution of the substrate W.

In an example embodiment, the refrigerant supplier 230 may supply the refrigerant 180 to each of the first region R1 and the second region R2 under the substrate W in an independent manner such that pressures of the refrigerant 180 in the first region R1 and the second region R2 may be different. As the pressure of the refrigerant 180 in the first region R1 and/or the second region R2 increases, heat transfer efficiency for a region of the substrate W corresponding to the first region R1 and/or the second region R2 may increase. The pressure of the refrigerant 180 for each of the first region R1 and the second region R2 may be determined in accordance with the temperature distribution of the substrate W.

Figure 6:
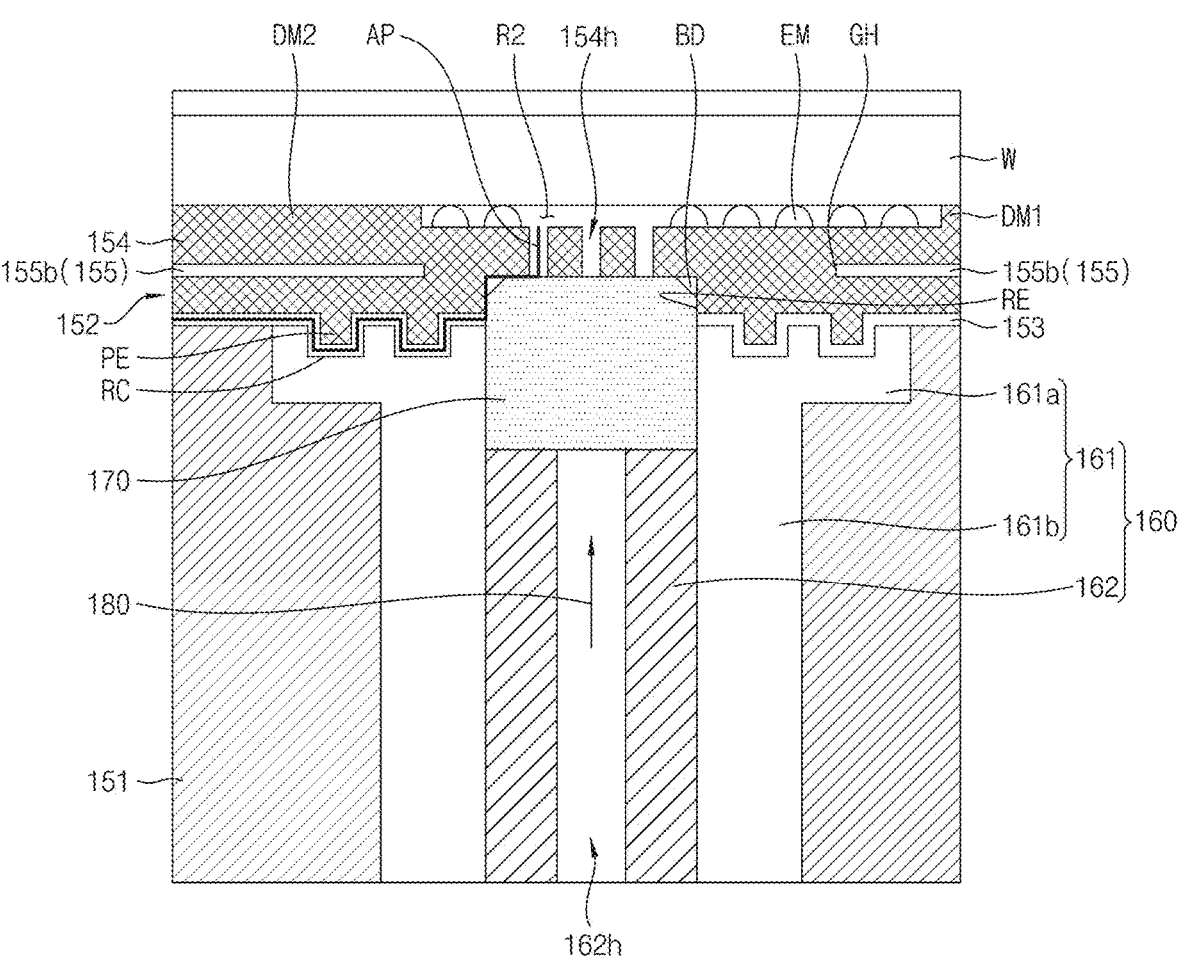
FIG. 6 is an enlarged view of the portion A of FIG. 1 according to an example embodiment.

FIG. 6 is an enlarged view of the portion A of FIG. 1 according to an example embodiment.

Referring to FIG. 6, the upper plate 152 may further include a protrusion PE. The protrusion PE of the upper plate 152 may be formed at a position vertically overlapping with the first bushing 161. The upper plate 152 may include a plurality of protrusions PE. The upper plate 152 may include a cross-section having an uneven shape formed by the protrusions PE. The first bushing 161 may include a recess RC. The first bushing 161 may include a plurality of recesses RC. The recess RC of the first bushing 161 may be recessed from the upper plate 152 toward the first bushing 161. The recess RC of the first bushing 161 may be formed at a position corresponding to the protrusion PE of the upper plate 152. The first bushing 161 may include a cross-section having an uneven shape formed by the recess RC. The uneven shape of the first bushing 161 may correspond to the uneven shape of the upper plate 152. The protrusion PE of the upper plate 152 may be inserted into the recess RC of the first bushing 161. The adhesive layer 153 may be disposed between the upper plate 152 and the first bushing 161, and may be disposed in the recess RC of the first bushing 161. The adhesive layer 153 may cover the protrusion PE of the upper plate 152 in the recess RC of the first bushing 161. The adhesive layer 153 may extend along the profile of the uneven shape formed by the protrusion PE of the upper plate 152. The adhesive layer 153 may extend along the profile of the uneven shape formed by the recess RC of the first bushing 161.

When the upper plate 152 includes the protrusion PE, and the first bushing 161 includes the recess RC corresponding to the protrusion PE, the length of an aching path AP between the upper plate 152 and the first bushing 161 may increase. Accordingly, probability of occurrence of aching may be reduced.

In an example embodiment, even when the upper plate 152 includes the protrusion PE, and the first bushing 161 includes the recess RC corresponding to the protrusion PE, the thickness of the adhesive layer 153 between the first bushing 161 and the upper plate 152 may be different from the thickness of the adhesive layer 153 between the base plate 151 and the upper plate 152. For example, the thickness of the adhesive layer 153 between the first bushing 161 and the upper plate 152 may be smaller than the thickness of the adhesive layer 153 between the base plate 151 and the upper plate 152.

Figure 7:
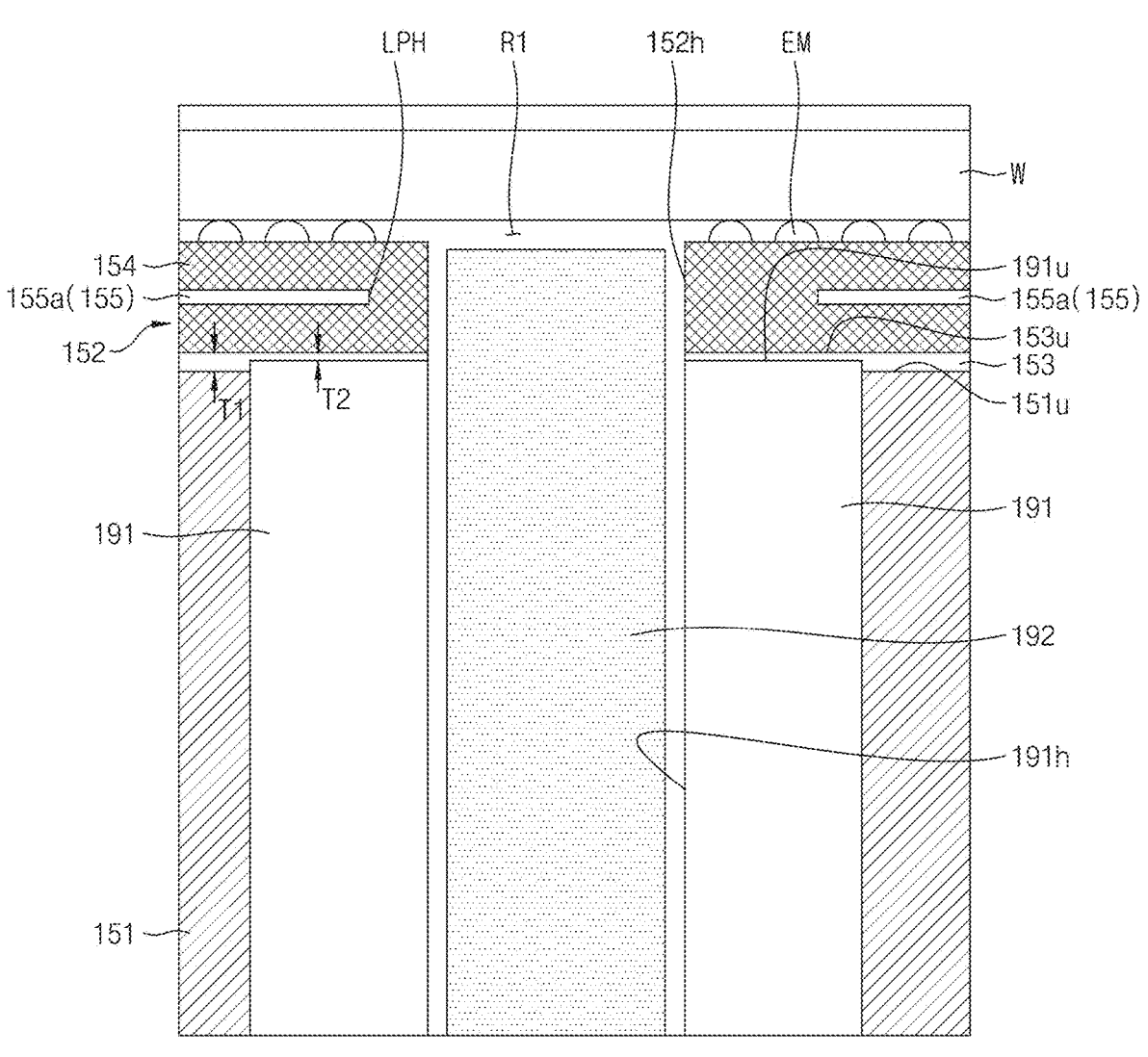
FIG. 7 is an enlarged view of a portion B of FIG. 1 according to an example embodiment.

FIG. 7 is an enlarged view of a portion B of FIG. 1 according to an example embodiment.

Referring to FIGS. 1 and 7, the electrostatic chuck 150 may include a lift pin bushing 191 and a lift pin 192. The lift pin bushing 191 may be disposed in the base plate 151. The lift pin bushing 191 may include a through hole 191h vertically extending through the upper plate 152. The upper plate 152 may include a pin hole 152h vertically extending through the upper plate 152. The through hole 191h and the pin hole 152h may vertically overlap each other, and may communicate with each other. The through hole 191h and the pin hole 152h may be interconnected and, as such, may form one vertical hole.

The lift pin 192 may be disposed in the through hole 191h of the lift pin bushing 191. The lift pin 192 may vertically extend such that an upper portion thereof may be disposed in the pin hole 152h of the upper plate 152. The lift pin 192 may be disposed in the vertical hole formed through interconnection of the through hole 191h and the pin hole 152h. The lift pin 192 may be connected to a lift pin driver 240. The lift pin driver 240 may lift the lift pin 192 upwards when electrostatic force of the electrostatic chuck 150 is released in a dechucking procedure, thereby lifting the substrate W such that the substrate W is separated from the electrostatic chuck 150.

A top surface 191u of the lift pin bushing 191 may be disposed at a higher level than a top surface 151u of the base plate 151 with reference to the bottom surface of the base plate 151. The top surface 191u of the lift pin bushing 191 may be disposed at a lower level than the bottom surface of the upper plate 152. The adhesive layer 153 may be interposed between the base plate 151 and the upper plate 152 and between the lift pin bushing 191 and the upper plate 152. The top surface 191u of the lift pin bushing 191 may be disposed at a lower level than a top surface 153u of the adhesive layer 153 with reference to the bottom surface of the base plate 151. A thickness T1 of the adhesive layer 153 between the base plate 151 and the upper plate 152 may be greater than a thickness T2 of the adhesive layer 153 between the lift pin bushing 191 and the upper plate 152. As the thickness T2 of the adhesive layer 153 between the lift pin bushing 191 and the upper plate 152 is reduced, insulation strength for the adhesive layer 153 and/or the lift pin bushing 191 may increase.

Referring to FIGS. 1, 2 and 7, the first electrode 155a of the upper plate 152 may include the second hole LPH, as described above. The second hole LPH may vertically overlap with the lift pin 192, the pin hole 152h, and the through hole 191h. The second hole LPH may vertically overlap with at least a portion of the lift pin bushing 191. The lift pin 192 and the pin hole 152h may extend through the second hole LPH. The first electrode 155a may be spaced apart from the lift pin 192. The first electrode 155a may be spaced apart from the pin hole 152h.

Figure 8:
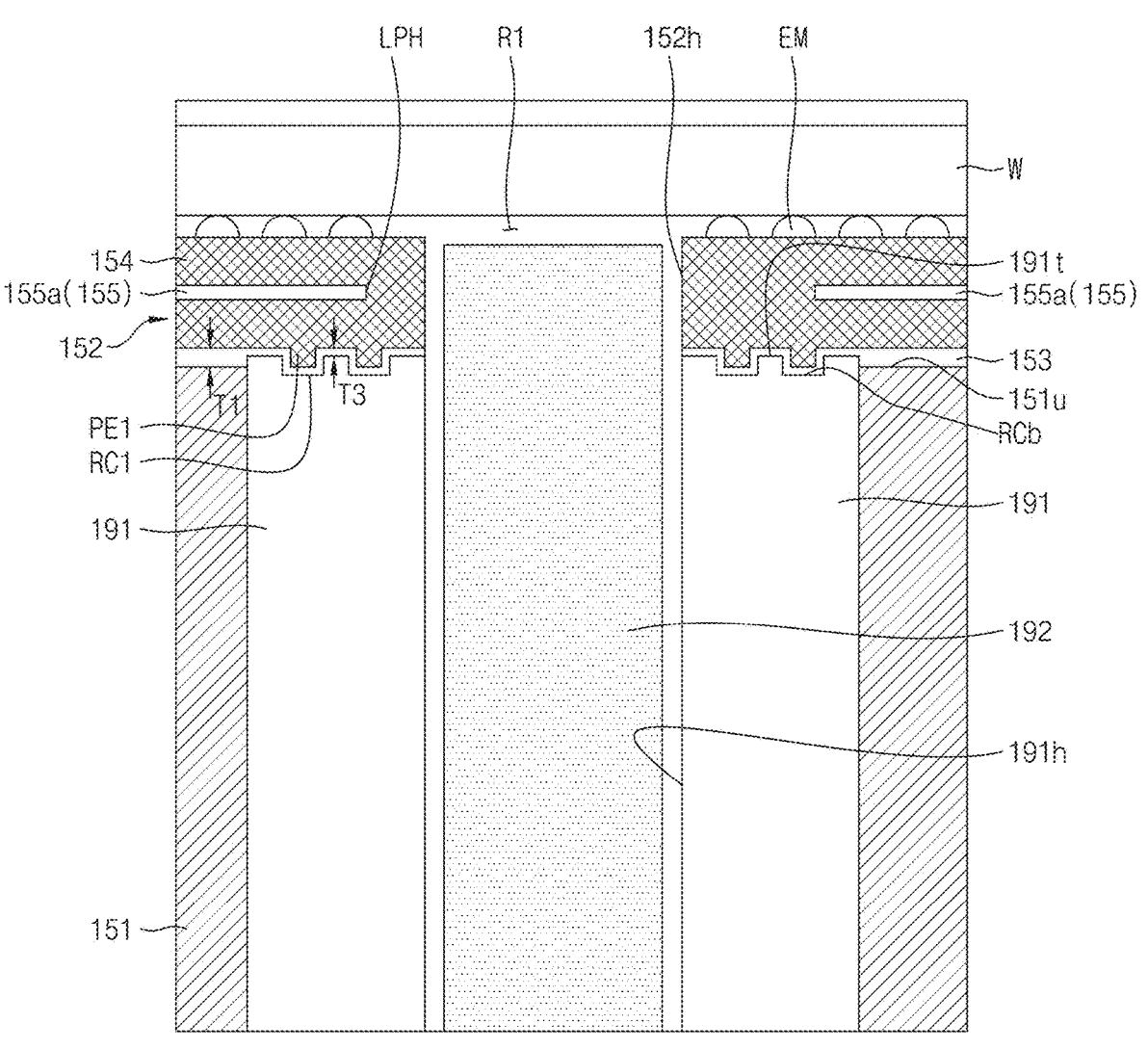
FIG. 8 is an enlarged view of the portion B of FIG. 1 according to an example embodiment.

FIG. 8 is an enlarged view of the portion B of FIG. 1 according to an example embodiment.

Referring to FIG. 8, the upper plate 152 may further include a protrusion PE1. The protrusion PE1 of the upper plate 152 may be formed at a position vertically overlapping with the lift pin bushing 191. The upper plate 152 may include a plurality of protrusions PE1. The upper plate 152 may include a cross-section having an uneven shape formed by the protrusions PE1. The lift pin bushing 191 may include a recess RC1. The lift pin bushing 191 may include a plurality of recesses RC1. The recess RC1 of the lift pin bushing 191 may be recessed from the upper plate 152 toward the lift pin bushing 191. The recess RC1 of the lift pin bushing 191 may be formed at a position corresponding to the protrusion PE1 of the upper plate 152. The lift pin bushing 191 may include a cross-section having an uneven shape formed by the recess RC1. The uneven shape of the lift pin bushing 191 may correspond to the uneven shape of the upper plate 152. The protrusion PE1 of the upper plate 152 may be inserted into the recess RC1 of the lift pin bushing 191.

In an example embodiment, an upper end 191t of the lift pin bushing 191 may be disposed at a higher level than the top surface 151u of the base plate 151 with reference to the bottom surface of the base plate 151. A bottom surface RCb of the recess RC1 of the lift pin bushing 191 may be disposed at a lower level than the top surface 151u of the base plate 151 with reference to the bottom surface of the base plate 151.

The adhesive layer 153 may be disposed between the upper plate 152 and the lift pin bushing 191, and may be disposed in the recess RC1 of the lift pin bushing 191. The adhesive layer 153 may cover the protrusion PE1 of the upper plate 152 in the recess RC1 of the lift pin bushing 191. The adhesive layer 153 may extend along the profile of the uneven shape formed by the protrusion PE1 of the upper plate 152. The adhesive layer 153 may extend along the profile of the uneven shape formed by the recess RC1 of the lift pin bushing 191. The thickness T1 of the adhesive layer 153 between the base plate 151 and the upper plate 152 may be greater than a thickness T3 of the adhesive layer 153 between the lift pin bushing 191 and the upper plate 152. As the thickness T3 of the adhesive layer 153 between the lift pin bushing 191 and the upper plate 152 is reduced, insulation strength for the adhesive layer 153 and/or the lift pin bushing 191 may increase.

As a plasma is produced in the chamber 110 and, as such, a potential difference of a predetermined level or more is generated between the substrate W and the electrostatic chuck 150, aching may occur between the lift pin 192 and the upper plate 152 and between the upper plate 152 and the lift pin bushing 191. Due to aching, the lift pin 192, the lift pin bushing 191 and the upper plate 152 may be damaged. Probability of occurrence of aching may be reduced as the length of an aching path increases. For example, the aching path may include a region of the pin hole 152h between the upper plate 152 and the lift pin 192 and a region between the upper plate 152 and the lift pin bushing 191. When the upper plate 152 includes the protrusion PE1, and the lift pin bushing 191 includes the recess RC1 corresponding to the protrusion PE1, the length of the aching path between the upper plate 152 and the lift pin bushing 191 may increase. Accordingly, probability of occurrence of aching may be reduced.

In accordance with the example embodiments of the disclosure, the electrostatic chuck of the substrate processing apparatus may include a plurality of electrodes, and may control voltages respectively applied to the plurality of electrodes such that levels of the voltages may be different and, as such, chucking force may be controlled on a substrate region basis such that chucking forces applied to different regions of a substrate may be different. Through the control, a temperature distribution of the substrate may be adjusted. In addition, the electrostatic chuck of the substrate processing apparatus may include a bushing capable of lengthening an aching path, thereby reducing probability of occurrence of aching in the vicinity of the bushing and minimizing a space in which a discharge plasma is generated. Accordingly, probability of generation of a discharge plasma may be reduced.

The controller 220 and/or the components included therein may include processing circuitry such as hardware including logic circuits; a hardware/software combination such as a processor executing software; or a combination thereof. For example, the processing circuity may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A substrate processing apparatus comprising:
a base plate;
an upper plate on the base plate;
a DC power supply configured to supply power to the upper plate; and
a controller interconnecting the upper plate and the DC power supply,

wherein the upper plate includes
a first dam defining a first region,
a second dam defining a second region together with the first dam,
an embossed portion disposed in each of the first region and the second region,
a first electrode vertically below the first region, and
a second electrode spaced apart from the first electrode and vertically below the second region,
wherein the controller includes
a first controller interconnecting the first electrode and the DC power supply, and
a second controller interconnecting the second electrode and the DC power supply,
wherein the DC power supply is configured to apply a first voltage to the first electrode via the first controller, and configured to apply a second voltage to the second electrode via the second controller,
wherein the first voltage and the second voltage are different,
wherein a first distance from a bottom surface of the upper plate to the first electrode is different from a second distance from the bottom surface of the upper plate to the second electrode, and
wherein an upper surface of the first electrode and a lower surface of the second electrode are vertically spaced from each other.

2. The substrate processing apparatus according to claim 1, wherein the second electrode surrounds the first electrode in a first plane.

3. The substrate processing apparatus according to claim 1, wherein the controller is configured to apply the second voltage that is higher than the first voltage.

4. The substrate processing apparatus according to claim 1, further comprising:
a porous block having a portion in the base plate, wherein the upper plate includes a first recess in which the portion of the porous block is disposed.

5. The substrate processing apparatus according to claim 4, wherein a top surface of the porous block is at a higher level than a top surface of the base plate.

6. The substrate processing apparatus according to claim 4, further comprising:
a first bushing in the base plate; and
a second bushing in the first bushing,
wherein a top surface of the porous block is at a higher level than a top surface of the first bushing.

7. The substrate processing apparatus according to claim 6, wherein
the first bushing includes
a cylinder portion surrounding the second bushing, and
a flange portion on the cylinder portion, and
the flange portion protrudes outwards from an outer side surface of the cylinder portion.

8. The substrate processing apparatus according to claim 6, wherein the upper plate includes a protrusion protruding toward the first bushing.

9. The substrate processing apparatus according to claim 8, wherein the first bushing includes a second recess receiving the protrusion.

10. The substrate processing apparatus according to claim 1, further comprising:
a lift pin bushing in the base plate;
a lift pin in the lift pin bushing; and
an adhesive layer between the upper plate and the base plate and between the upper plate and the lift pin bushing.

11. The substrate processing apparatus according to claim 10, wherein a first thickness of a first portion of the adhesive layer between the upper plate and the base plate is greater than a second thickness of a second portion of the adhesive layer between the upper plate and the lift pin bushing.

12. The substrate processing apparatus according to claim 10, wherein a top surface of the lift pin bushing is at a higher level than a top surface of the base plate.

13. The substrate processing apparatus according to claim 10, wherein the upper plate includes a protrusion protruding toward the lift pin bushing.

14. The substrate processing apparatus according to claim 13, wherein the lift pin bushing includes a recess receiving the protrusion.

15. A substrate processing apparatus comprising:
an electrostatic chuck including a base plate, an upper plate on the base plate, and a bushing and a porous block in the base plate;
a DC power supply configured to supply power to the upper plate; and
a controller interconnecting the upper plate and the DC power supply,
wherein the upper plate includes
a first dam defining a first region,
a second dam defining a second region together with the first dam,
an embossed portion disposed in each of the first region and the second region,
a first electrode vertically below the first region, and
a second electrode spaced apart from the first electrode and vertically below the second region,
wherein the controller includes
a first controller interconnecting the first electrode and the DC power supply, and
a second controller interconnecting the second electrode and the DC power supply,
wherein the DC power supply is configured to apply a first voltage to the first electrode via the first controller, and configured to apply a second voltage to the second electrode via the second controller,
wherein the first voltage and the second voltage are different,
wherein a first distance from a bottom surface of the upper plate to the first electrode is different from a second distance from the bottom surface of the upper plate to the second electrode,
wherein an upper surface of the first electrode and a lower surface of the second electrode are vertically spaced from each other,
wherein the bushing includes
a first bushing contacting the base plate, and
a second bushing in the first bushing,
wherein the porous block is on the second bushing in the first bushing, wherein the first bushing includes
a cylinder portion surrounding the second bushing, and
a flange portion surrounding a portion of the porous block, and
wherein a first thickness of the flange portion is greater than a second thickness of the cylinder portion.

16. The substrate processing apparatus according to claim 15, wherein:
the electrostatic chuck further includes an adhesive layer between the first bushing and the upper plate; and
a top surface of the porous block is at a higher level than the adhesive layer.

17. The substrate processing apparatus according to claim 16, wherein the upper plate includes a recess in which a portion of the porous block is disposed.

18. A substrate processing apparatus comprising:
an electrostatic chuck including a base plate, an upper plate on the base plate, and a lift pin bushing and a lift pin in the base plate;
a DC power supply configured to supply power to the upper plate; and
a controller interconnecting the upper plate and the DC power supply,
wherein the upper plate includes
a first dam defining a first region,
a second dam defining a second region together with the first dam,
an embossed portion disposed in each of the first region and the second region,
a first electrode vertically below the first region, and
a second electrode spaced apart from the first electrode and vertically below the second region,
wherein a first distance from a bottom surface of the upper plate to the first electrode is different from a second distance from the bottom surface of the upper plate to the second electrode,
wherein an upper surface of the first electrode and a lower surface of the second electrode are vertically spaced from each other,
wherein the controller includes
a first controller interconnecting the first electrode and the DC power supply, and
a second controller interconnecting the second electrode and the DC power supply,
wherein the DC power supply is configured to apply a first voltage to the first electrode via the first controller, and configured to apply a second voltage to the second electrode via the second controller,
wherein the first voltage and the second voltage are different, and
wherein the lift pin is in the lift pin bushing, and a top surface of the lift pin bushing is at a higher level than a top surface of the base plate.

* * * * *